(12) United States Patent
Nakayama

(10) Patent No.: US 9,229,037 B2
(45) Date of Patent: Jan. 5, 2016

(54) MEASUREMENT APPARATUS AND MEASUREMENT METHOD

(71) Applicant: ADVANTEST CORPORATION, Tokyo (JP)

(72) Inventor: Yoshikazu Nakayama, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 289 days.

(21) Appl. No.: 13/932,014

(22) Filed: Jul. 1, 2013

(65) Prior Publication Data

US 2014/0062455 A1 Mar. 6, 2014

(30) Foreign Application Priority Data

Aug. 29, 2012 (JP) .................................. 2012-188965

(51) Int. Cl.
- *G01R 23/02* (2006.01)
- *G01R 35/00* (2006.01)
- *G01R 31/28* (2006.01)

(52) U.S. Cl.
CPC .............. *G01R 23/02* (2013.01); *G01R 35/005* (2013.01); *G01R 31/2841* (2013.01)

(58) Field of Classification Search
CPC ...... G01R 23/02; G01R 23/20; G01R 35/005; G01R 31/2834; G01R 31/2837; G01R 31/31908; G06J 1/00; H04B 17/345
See application file for complete search history.

(56) References Cited

U.S. PATENT DOCUMENTS

| | | | |
|---|---|---|---|
| 4,916,677 A * | 4/1990 | Fox ........................ | G01R 13/32 324/76.54 |
| 5,113,139 A * | 5/1992 | Furukawa ..................... | 324/623 |
| 7,106,115 B2 * | 9/2006 | Carley et al. .................. | 327/164 |
| 7,774,154 B2 * | 8/2010 | Sato et al. ..................... | 702/117 |
| 2003/0046064 A1* | 3/2003 | Moriya et al. ................ | 704/201 |
| 2004/0123018 A1* | 6/2004 | Miller et al. .................. | 711/100 |
| 2006/0215064 A1* | 9/2006 | Dawson ................. | H03L 7/081 348/730 |
| 2007/0019768 A1* | 1/2007 | Furukawa et al. ............ | 375/355 |
| 2010/0310006 A1* | 12/2010 | Asami ............................ | 375/296 |
| 2011/0043218 A1* | 2/2011 | Wang ................. | G01R 31/2837 324/537 |

FOREIGN PATENT DOCUMENTS

| | | |
|---|---|---|
| JP | 2008-286699 A | 11/2008 |
| JP | 2010-117349 A | 5/2010 |

* cited by examiner

*Primary Examiner* — Tung X Nguyen
*Assistant Examiner* — David Frederiksen

(57) ABSTRACT

To accurately measure a frequency characteristic of a waveform generating apparatus, provided is a measurement apparatus that measures a frequency characteristic of a waveform generating apparatus generating a signal having a waveform corresponding to waveform data, comprising a control section that causes a plurality of sine wave signals having different frequencies to be sequentially output from the waveform generating apparatus; a measuring section that measures each of the sine wave signals output from the waveform generating apparatus; and a calculating section that calculates a frequency characteristic of the waveform generating apparatus based on the measurement results of the measuring section. The control section causes trigger signals to be output from the waveform generating apparatus and causes the sine wave signals to be output in synchronization with the trigger signals, and the measuring section measures a phase of each sine wave signal with the corresponding trigger signal as a reference.

12 Claims, 9 Drawing Sheets

| FREQUENCY [MHz] | AMPLITUDE AND PHASE OF SINE WAVE SIGNALS OUTPUT FROM WAVEFORM GENERATING APPARATUS | | AMPLITUDE AND PHASE OF SINE WAVE SIGNALS MEASURED BY MEASURING SECTION | | FREQUENCY CHARACTERISTIC OF WAVEFORM GENERATING APPARATUS | |
|---|---|---|---|---|---|---|
| | AMPLITUDE A[V] | PHASE $\alpha$ [deg] | AMPLITUDE B[V] | PHASE $\beta$ [deg] | AMPLITUDE [unit] | PHASE [deg] |
| 100 | $A_1$ | $\alpha_1$ | $B_1$ | $\beta_1$ | $B_1/A_1$ | $\beta_1-\alpha_1$ |
| 200 | $A_2$ | $\alpha_2$ | $B_2$ | $\beta_2$ | $B_2/A_2$ | $\beta_2-\alpha_2$ |
| 300 | $A_3$ | $\alpha_3$ | $B_3$ | $\beta_3$ | $B_3/A_3$ | $\beta_3-\alpha_3$ |
| ... | ... | ... | ... | ... | ... | ... |
| 10000 | $A_{100}$ | $\alpha_{100}$ | $B_{100}$ | $\beta_{100}$ | $B_{100}/A_{100}$ | $\beta_{100}-\alpha_{100}$ |

FIG. 4

MEASUREMENT APPARATUS AND MEASUREMENT METHOD

BACKGROUND

1. Technical Field

The present invention relates to a measurement apparatus and a measurement method.

2. Related Art

A known waveform generator generates a signal having a waveform that corresponds to waveform data and a known digitizer acquires waveform data indicating the waveform of a signal input thereto. Conventionally, such a waveform generator and digitizer generate and acquire a signal having a frequency that is approximately from tens of megahertz to hundreds of megahertz.

Japanese Patent Application Publication No. 2010-117349
Japanese Patent Application Publication No. 2008-286699

However, in recent years, waveform generators and digitizers have been developed that generate and acquire signals having a frequency from several gigahertz to tens of gigahertz. Such a waveform generator and digitizer used for high frequency signals include internal circuits with frequency characteristics that greatly affect the accuracy of the generated signal and of the acquired signal. Accordingly, the waveform generator and digitizer must be calibrated by measuring the frequency characteristics of the internal circuits in advance.

A method for measuring the frequency characteristic of a waveform generator includes causing a square wave, for example, to be generated from the waveform generator under measurement and acquiring the waveform by using a digitizer serving as a reference, i.e. a digitizer having a flat frequency characteristic. The frequency characteristic of the waveform generator under measurement is calculated based on the waveform data acquired by the digitizer serving as a reference and the waveform data indicating the waveform of the signal generated by the waveform generator.

Furthermore, a method for measuring a frequency characteristic of a digitizer includes causing a square wave, for example, to be generated from a waveform generator serving as a reference, i.e. a waveform generator having a flat frequency characteristic, and acquiring the waveform by using the digitizer under measurement. The frequency characteristic of the digitizer under measurement is calculated based on the waveform data acquired by the digitizer under measurement and the waveform data indicating the waveform of the signal generated by the waveform generator.

However, the frequency component of a square wave has a power that decreases as the frequency increases. Accordingly, when using the methods described above, there is a large error in the frequency characteristic in the high frequency band.

SUMMARY

Therefore, it is an object of an aspect of the innovations herein to provide a measurement apparatus and a measurement method, which are capable of overcoming the above drawbacks accompanying the related art. The above and other objects can be achieved by combinations described in the claims. According to a first aspect of the present invention, provided is a measurement apparatus that measures a frequency characteristic of a waveform generating apparatus generating a signal having a waveform corresponding to waveform data, comprising a control section that causes a plurality of sine wave signals having different frequencies to be sequentially output from the waveform generating apparatus; a measuring section that measures each of the sine wave signals output from the waveform generating apparatus; and a calculating section that calculates a frequency characteristic of the waveform generating apparatus based on the measurement results of the measuring section. Also provided is a measurement method.

According to a second aspect of the present invention, provided is a measurement apparatus that measures a frequency characteristic of a waveform generating apparatus generating a signal having a waveform corresponding to waveform data, comprising a control section that causes a trigger signal to be output from the waveform generating apparatus and causes a signal under measurement to be output from the waveform generating apparatus in synchronization with the trigger signal; a measuring section that measures the signal under measurement output from the waveform generating apparatus using the trigger signal as a reference; and a calculating section that calculates a frequency characteristic of the waveform generating apparatus based on the measurement results of the measuring section. Also provided is a measurement method.

According to a third aspect of the present invention, provided is a measurement apparatus that measures a frequency characteristic of a waveform acquiring apparatus generating waveform data by sampling a signal, comprising a control section that causes a plurality of sine wave signals having different frequencies to be output sequentially from a waveform generating apparatus and causes the waveform acquiring apparatus to acquire waveform data of the sine wave signals; and a calculating section that calculates a frequency characteristic of the waveform generating apparatus based on the waveform data of each sine wave signal acquired by the waveform acquiring apparatus. Also provided is a measurement method.

The summary clause does not necessarily describe all necessary features of the embodiments of the present invention. The present invention may also be a sub-combination of the features described above.

BRIEF DESCRIPTION OF THE DRAWINGS

FIG. 4 shows examples of waveform data (amplitude and phase for each frequency) of each of the sine wave signals output from the waveform generating apparatus 200, measurement data (amplitude and phase for each frequency) for each of the sine wave signals measured by the measurement apparatus 10, and frequency characteristics (amplitude characteristic and phase characteristic at each frequency) for the waveform generating apparatus 200 calculated by the calculating section 16.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
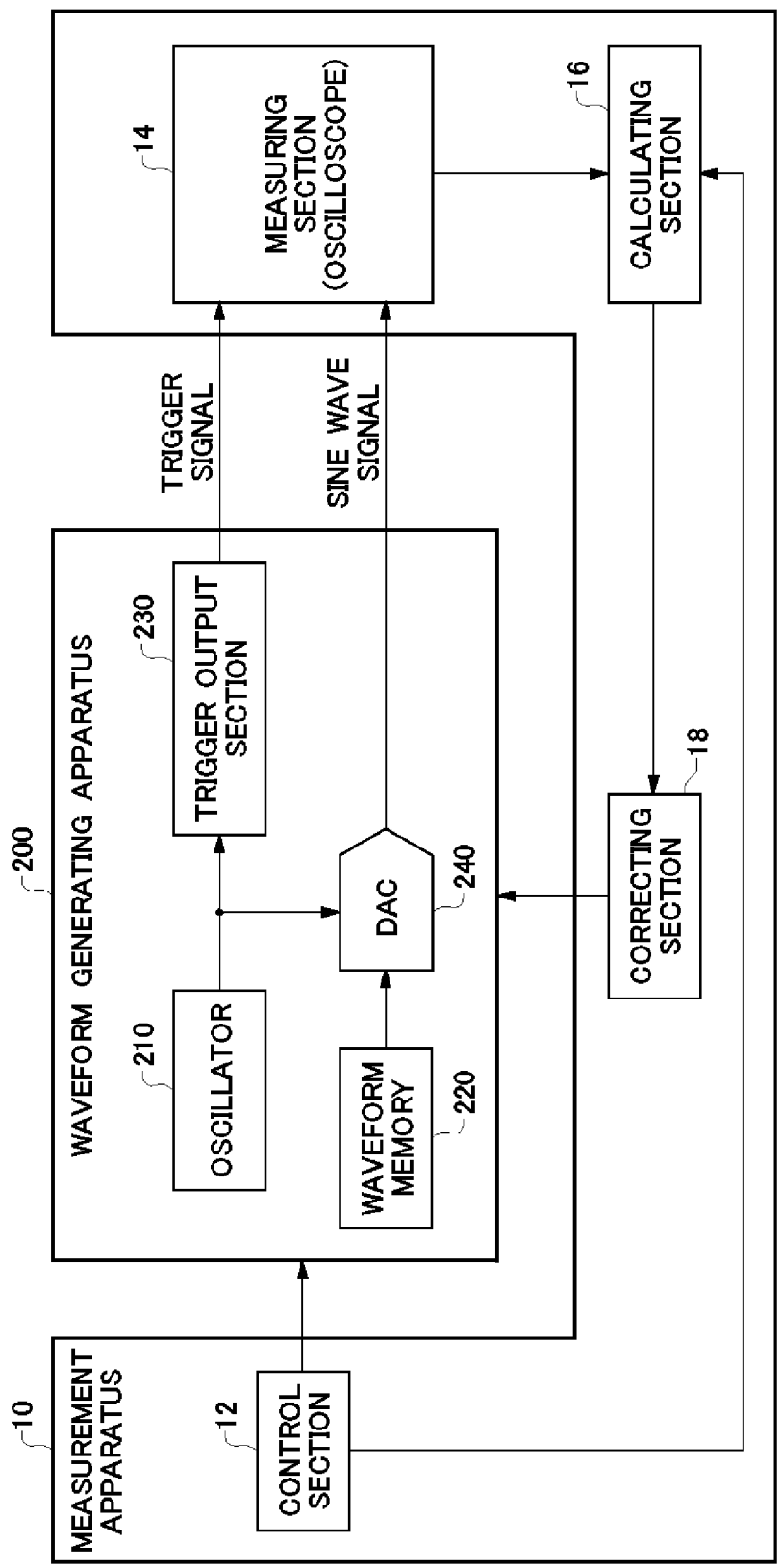
FIG. 1 shows a configuration of a waveform generating apparatus 200 that is a measurement target along with a configuration of a measurement apparatus 10 according to an embodiment of the present invention.
Figure 2:
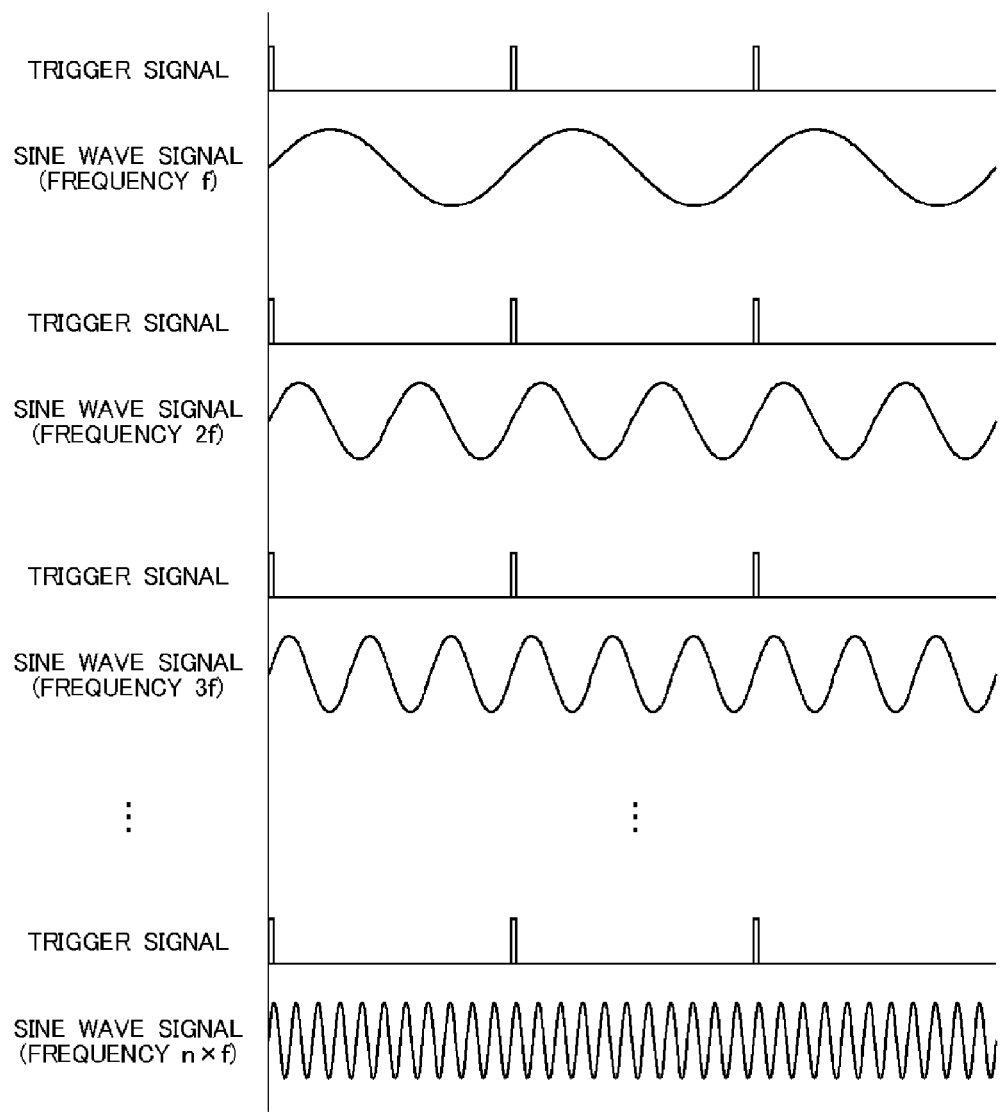
FIG. 2 shows an exemplary trigger signal and an exemplary sine wave signal that the measurement apparatus 10 of the present embodiment causes to be output from the waveform generating apparatus 200.

FIG. 1 shows a configuration of a waveform generating apparatus 200 that is a measurement target along with a configuration of a measurement apparatus 10 according to an embodiment of the present invention. FIG. 2 shows an exemplary trigger signal and an exemplary sine wave signal that the measurement apparatus 10 of the present embodiment causes to be output from the waveform generating apparatus 200.

The measurement apparatus 10 of the present embodiment measures a frequency characteristic of the waveform generating apparatus 200. The measurement apparatus 10 corrects the waveform generating apparatus 200 such that the frequency characteristic becomes flat, for example, based on the measurement result.

The waveform generating apparatus 200 generates a signal having a waveform corresponding to waveform data. The waveform generating apparatus 200 includes a waveform memory 220, an oscillator 210, a trigger output section 230, and a DAC 240, for example. The waveform memory 220 stores the waveform data indicating a waveform of the signal to be generated by the waveform generating apparatus 200. The oscillator 210 generates a clock signal.

The trigger output section 230 outputs the trigger signal that designates a timing for acquiring the signal. The trigger output section 230 outputs the trigger signal at constant periods, for example. The trigger output section 230 may output the clock signal at each constant period by dividing the trigger signal, for example. The trigger output section 230 is provided outside the waveform generating apparatus 200, and may generate the trigger signal by dividing the clock signal output from the waveform generating apparatus 200.

The DAC 240 performs a digital/analog conversion on the waveform data stored in the waveform memory 220, and outputs a signal with a waveform corresponding to the waveform data. In this case, the DAC 240 operates based on the clock signal generated by the oscillator 210. In this way, the DAC 240 can output a signal synchronized with the trigger signal output from the trigger output section 230.

The measurement apparatus 10 includes a control section 12, a measuring section 14, a calculating section 16, and a correcting section 18. The control section 12 causes the waveform generating apparatus 200 to output the trigger signal. The control section 12 may cause the trigger signal to be output with a constant period, for example.

The control section 12 causes the waveform generating apparatus 200 to sequentially output a plurality of sine wave signals having different frequencies, as a signal under measurement. In this case, the control section 12 outputs the sine wave signals in synchronization with the trigger signal. In other words, the control section 12 outputs the plurality of sine wave signals that each have a preset phase using the trigger signal as a reference.

When outputting the trigger signal with a constant period, for example, the control section 12 sets the frequency of each of the sine wave signals to be an integer multiple of the frequency of the trigger signal. For example, as shown in FIG. 2, if the frequency of the trigger signal is 100 MHz, the control section 12 outputs sine wave signals with frequencies of 100 MHz, 200 MHz, 300 MHz, . . . , 10 GHz.

In the present embodiment, the control section 12 outputs the trigger signal and the sine wave signals in parallel from the waveform generating apparatus 200. In other words, the control section 12 outputs the trigger signal and the sine wave signals through different transmission paths.

The measuring section 14 receives each of the sine wave signals and the trigger signal output from the waveform generating apparatus 200. The measuring section 14 measures the amplitude and phase of each of the sine wave signals output from the waveform generating apparatus 200. In this case, the measuring section 14 measures the phase of each of a plurality of trigger signals using the corresponding trigger signal as a reference. In the present embodiment, the measuring section 14 is an oscilloscope that receives the trigger signal and sine wave signals and acquires the waveforms of the sine wave signals using the trigger signal as a reference.

The calculating section 16 calculates the frequency characteristic of the waveform generating apparatus 200 based on the measurement results of the measuring section 14. More specifically, the calculating section 16 calculates the frequency characteristic of the waveform generating apparatus 200 based on the amplitude of the sine wave signals output from the waveform generating apparatus 200 and the phase of these sine wave signals relative to the trigger signal and on the amplitude of the sine wave signals measured by the measuring section 14 and the phase of these sine wave signals relative to the trigger signal.

The correcting section 18 corrects the frequency characteristic of the waveform generating apparatus 200 based on the frequency characteristic calculated by the calculating section 16. For example, the correcting section 18 may correct the waveform generating apparatus 200 such that the inverse of the calculated frequency characteristic is added to the original frequency characteristic of the waveform generating apparatus 200. With this configuration, the measurement apparatus 10 of the present embodiment can correct the frequency characteristic of the waveform generating apparatus 200 to become flat.

Figure 3:
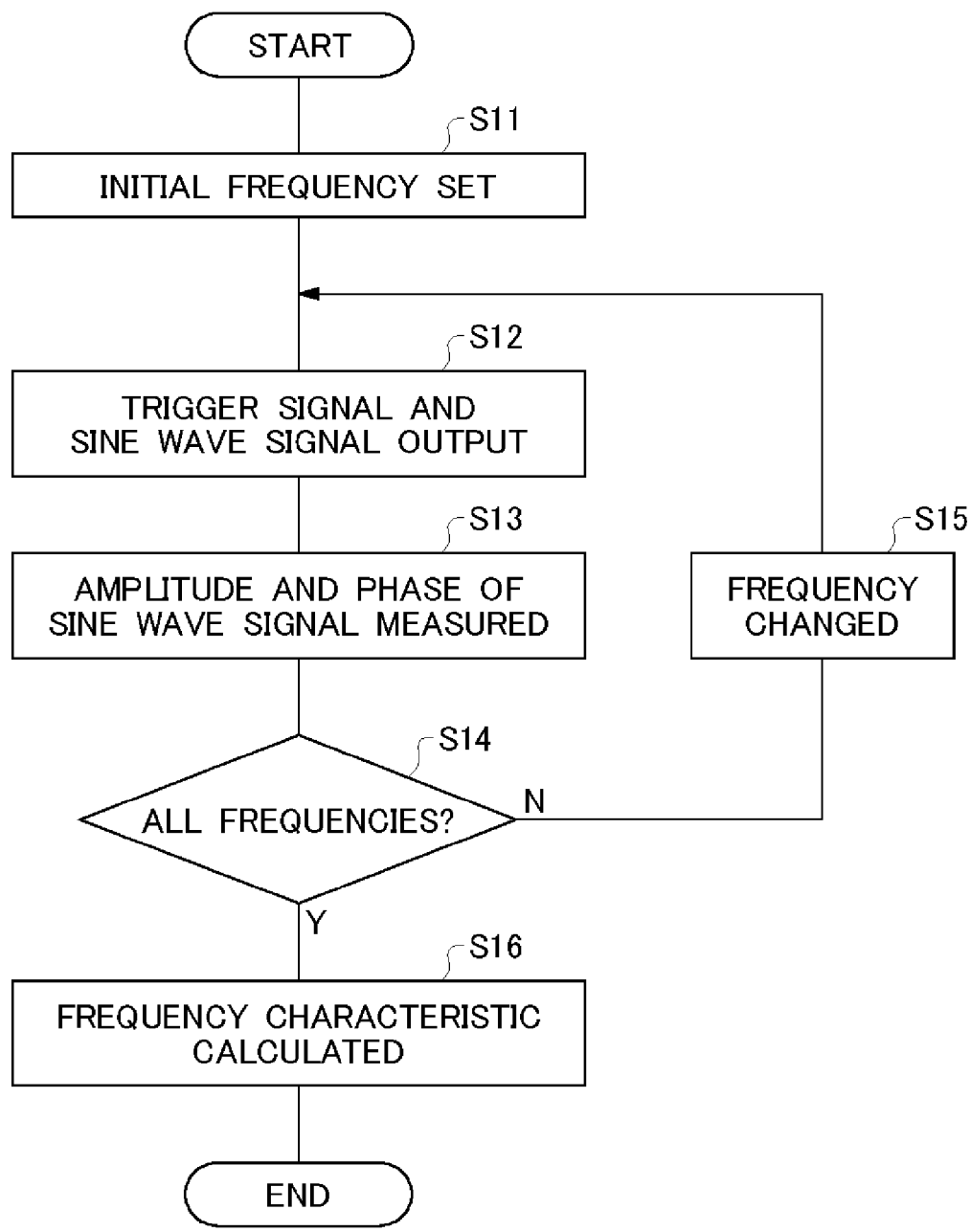
FIG. 3 shows a process flow performed by the measurement apparatus 10 according to the present embodiment.

FIG. 3 shows a process flow performed by the measurement apparatus 10 according to the present embodiment. By performing the process flow shown in FIG. 3, the measurement apparatus 10 corrects the frequency characteristic of the waveform generating apparatus 200.

First, at step S11, the control section 12 performs an initial setting of the frequency of the sine wave signal to be output. Next, at step S12, the control section 12 outputs from the waveform generating apparatus 200 the trigger signal and the sine wave signal having the set frequency. In this case, the control section 12 sets the amplitude of the sine wave signal to be a preset value and sets the phase of the sine wave signal relative to the trigger signal to be a preset value.

Next, at step S13, the measuring section 14 measures the amplitude of the sine wave signal output from the waveform generating apparatus 200 and the phase of the sine wave signal relative to the trigger signal. In the present embodiment, the measuring section 14 is an oscilloscope, and therefore the sampling of the waveform of the sine wave signal begins at the timing of the trigger signal and the sampled waveform is held for a prescribed period. The measuring section 14 measures the amplitude and the phase of the sine wave signal based on the sampled waveform. In the present embodiment, the measuring section 14 measures the amplitude and phase of the sine wave signal by using quadrature sampling, as described further below.

Next, at step S14, the control section 12 determines whether the measurement has been finished for all frequencies that are to be measured within the measurement band. If measurement has not been finished for all of the frequencies (the "No" of step S14), the control section 12 proceeds to step S15. At step S15, the control section 12 changes the frequency of the sine wave signal to be output. The control section 12 then returns to step S12, outputs the sine wave signal having the changed frequency (step S12), and performs measurement (step S13).

If measurement has been finished for all of the frequencies (the "Yes" of step S14), the control section 12 proceeds to step S16. At step S16, the control section 12 calculates the frequency characteristic within the measurement band based on the amplitude and phase of each of the sine wave signals.

By performing the process described above, the measurement apparatus 10 can measure the sine wave signals without decreasing the power of the signals in the high frequency band. As a result, using the measurement apparatus 10, the frequency characteristic of the waveform generating apparatus 200 can be measured accurately over the entire measurement frequency band.

FIG. 4 shows examples of waveform data (amplitude and phase for each frequency) of each of the sine wave signals output from the waveform generating apparatus 200, measurement data (amplitude and phase for each frequency) for each of the sine wave signals measured by the measurement apparatus 10, and frequency characteristics (amplitude characteristic and phase characteristic at each frequency) for the waveform generating apparatus 200 calculated by the calculating section 16.

As shown in FIG. 4, for each of the frequencies (e.g. 100 MHz, 200 Hz, 300 MHz, etc.) the control section 12 respectively outputs sine wave signals with a set amplitude A ($A_1$, $A_2$, $A_3$, etc.) and a set phase α ($α_1$, $α_2$, $α_3$, etc.) Here, the phase α is a value calculated using the output timing of the trigger signal output from the waveform generating apparatus 200 as a reference. The amplitude A and the phase α of the sine wave signals are preferably the same for each frequency, but these values may instead be different for each frequency of the sine wave signals.

As shown in FIG. 4, for each of the frequencies (e.g. 100 MHz, 200 Hz, 300 MHz, etc.) the measuring section 14 respectively measures and stores an amplitude B ($B_1$, $B_2$, $B_3$, etc.) and a phase ($β_1$, $β_2$, $β_3$, etc.) for the sine wave signals output from the waveform generating apparatus 200. Here, the phase β is a value calculated using the input timing of the trigger signal as a reference.

The calculating section 16 calculates the amplitude characteristic and the phase characteristic of the waveform generating apparatus 200 for each frequency, based on the amplitude A and phase α of the sine wave signals stored in the waveform memory 220 of the waveform generating apparatus 200 and on the amplitude B and phase β of the sine wave signals measured by the measuring section 14. More specifically, for each frequency, the calculating section 16 calculates the amplitude characteristic to be the ratio B/A, which is the ratio of the amplitude B of the sine wave signal measured by the measuring section 14 to the amplitude A of the sine wave signal stored in the waveform memory 220. Furthermore, for each frequency, the calculating section 16 calculates the phase characteristic to be a value of (β−α), which is obtained by subtracting the phase α of the sine wave signal stored in the waveform memory 220 from the phase β of the sine wave signal measured by the measuring section 14.

Figure 5:
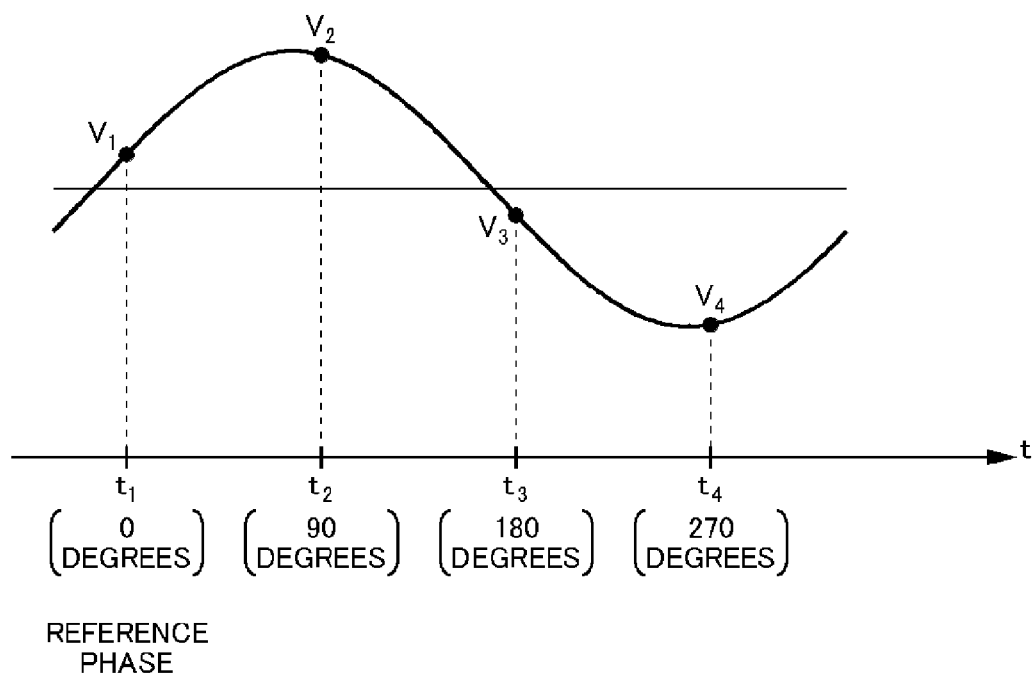
FIG. 5 shows exemplary sampling points acquired when calculating the amplitude and phase of the sine wave signal using the quadrature sampling technique.

FIG. 5 shows exemplary sampling points acquired when calculating the amplitude and phase of the sine wave signal using the quadrature sampling technique. In this embodiment, the measuring section 14 calculates the amplitude and phase for each of a plurality of sine wave signals using the quadrature sampling technique. Specifically, in the present embodiment, the measuring section 14 calculates the amplitude and phase for each of a plurality of sine wave signals based on the levels of the sampling points acquired while shifting the phase of the sine wave signal by ¼ of the period at a time.

Specifically, the measuring section 14 measures the timing at which a time corresponding to a predetermined phase has passed from the timing of the trigger signal to be the timing $t_1$ of a reference phase (0 degrees), based on the period of the sine wave signal under measurement and the timing of the trigger signal. Furthermore, the measuring section 14 identifies the timing $t_2$ of a phase (90 degrees) that has progressed by ¼ of a period from the reference phase, the timing $t_3$ of a phase (180 degrees) that has progressed by ½ of a period from the reference phase, and the timing $t_4$ of a phase (270 degrees) that has progressed by ¾ of a period from the reference phase, based on the period of the sine wave signal under measurement.

Next, the measuring section 14 acquires the sample value $V_1$ at the timing $t_1$ of the reference phase (0 degrees), the sample value $V_2$ at the timing $t_2$ of the phase (90 degrees) that has progressed by ¼ of a period from the reference phase, the sample value $V_3$ at the timing $t_3$ of the phase (180 degrees) that has progressed by ½ of a period from the reference phase, and the sample value $V_4$ at the timing $t_4$ of the phase (270 degrees) that has progressed by ¾ of a period from the reference phase in the sampled sine wave signal.

Next, as shown in Expression 1 below, the measuring section 14 calculates, as a real component R, a value obtained by dividing by 2 the value $V_1$-$V_3$, which is obtained by subtracting the sample value $V_3$ at the timing $t_3$ of the phase (180 degrees) that has progressed by ½ of a period from the reference phase from the sample value $V_1$ at the timing $t_1$ of the reference phase (0 degrees).
Expression 1:

$$R = \frac{V_1 - V_3}{2} \quad (1)$$

Next, as shown in Expression 2 below, the measuring section 14 calculates, as the imaginary component I, a value obtained by dividing by 2 the value $V_2$-$V_4$, which is obtained by subtracting the sample value $V_4$ at the timing $t_4$ of the phase (270 degrees) that has progressed by ¾ of a period from the reference phase from the sample value $V_2$ at the timing $t_2$ of the phase (90 degrees) that has progressed by ¼ of a period from the reference phase.
Expression 2:

$$I = \frac{V_2 - V_4}{2} \quad (2)$$

As shown in Expression 3 below, the calculating section 16 calculates, as the amplitude component B at the corresponding frequency, the root mean square of the sum of the square of the real component R and the square of the imaginary component I.

Expression 3:

$$B=\sqrt{(R^2+I^2)} \quad (3)$$

Furthermore, the calculating section 16 calculates the phase β at the corresponding frequency based on the real component R and the imaginary component I. For example, when the real component R is 0 or greater (0≤R), as shown in Expression 4 below, the calculating section 16 calculates, as the phase β at the corresponding frequency, the arctangent of the ratio of the imaginary component I to the real component R.

Expression 4:

$$\beta=\tan^{-1}(I/R) \quad (4)$$

Furthermore, when the real component R is less than 0 (R<0), for example, as shown in Expression 5 below, the calculating section 16 calculates, as the phase β at the corresponding frequency, a value obtained by adding 180° to the arctangent of the ratio of the imaginary component I to the real component R.

Expression 5:

$$\beta=180+\tan^{-1}(I/R) \quad (5)$$

By using the quadrature sampling technique in this way, the calculating section 16 can accurately calculate the amplitude and phase while omitting the error of the DC component.

Figure 6:
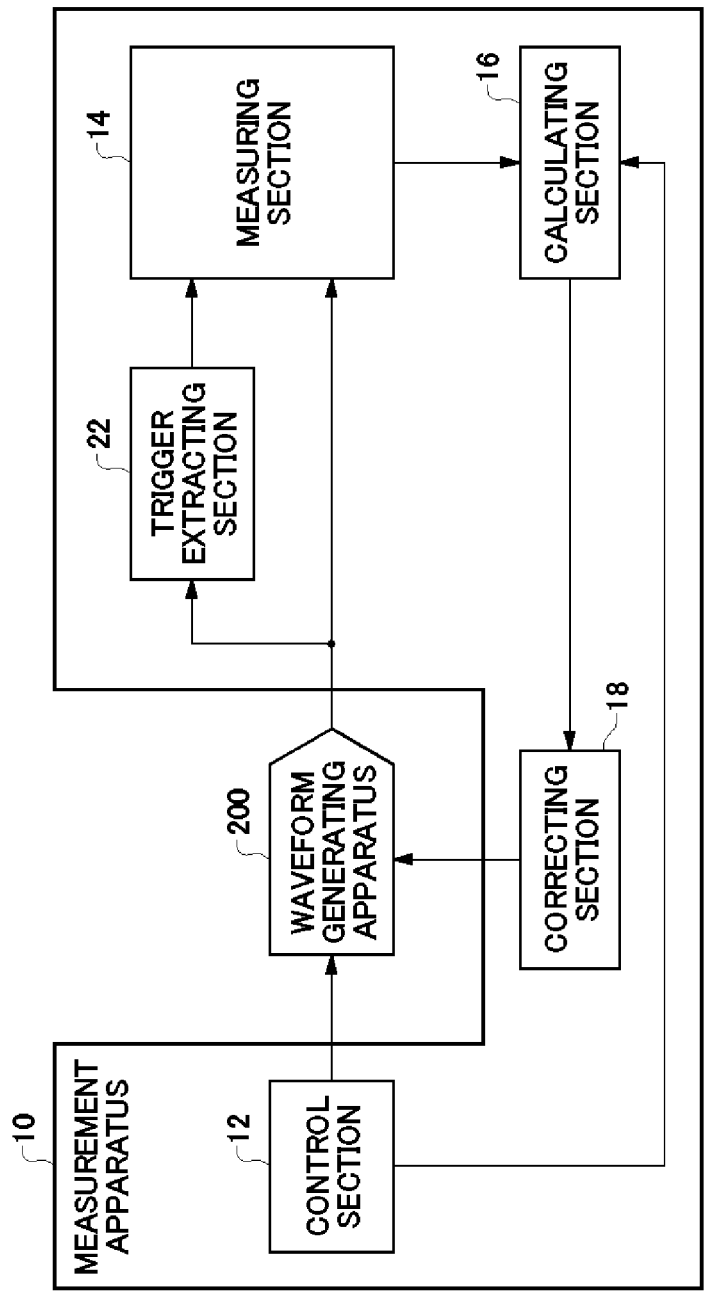
FIG. 6 shows a configuration of the measurement apparatus 10 according to a first modification of the present embodiment, along with the waveform generating apparatus 200.
Figure 7:
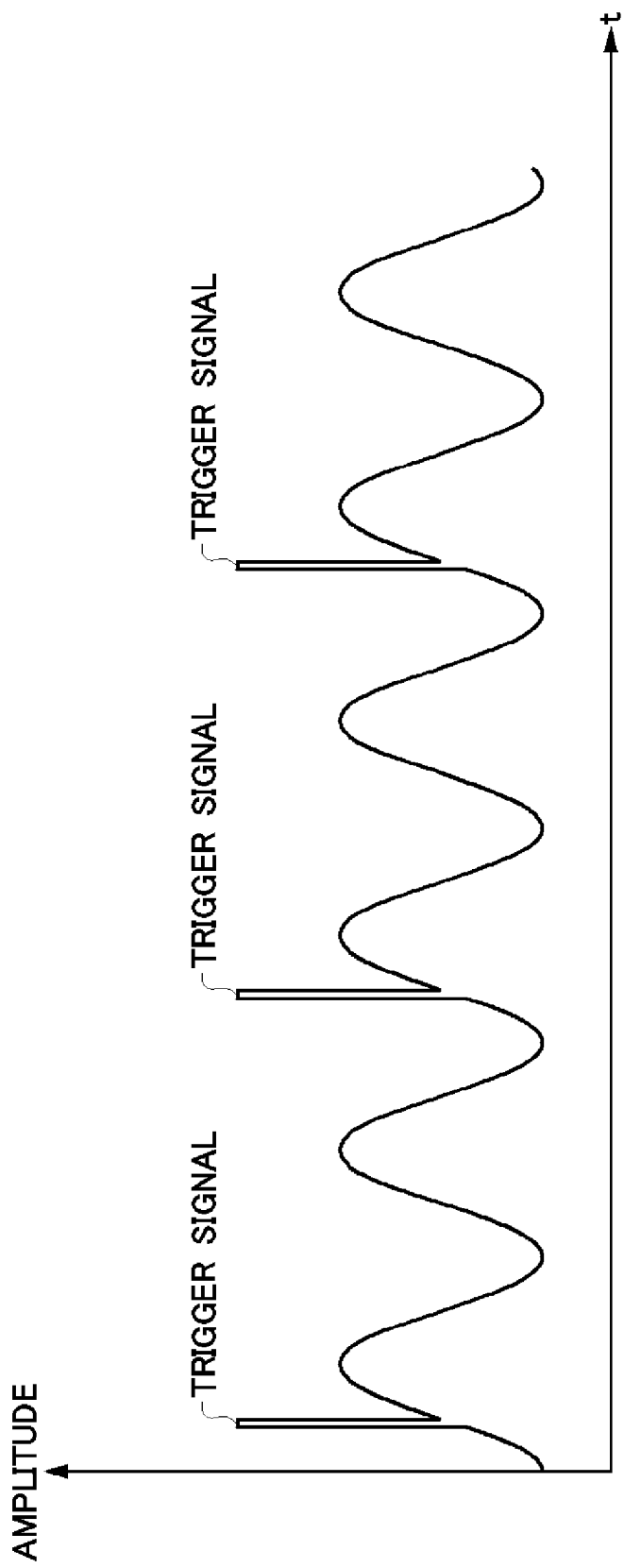
FIG. 7 shows an example of a sine wave signal on which the trigger signal is superimposed.

FIG. 6 shows a configuration of the measurement apparatus 10 according to a first modification of the present embodiment, along with the waveform generating apparatus 200. FIG. 7 shows an example of a sine wave signal on which the trigger signal is superimposed. The measurement apparatus 10 of the present modification adopts substantially the same function and configuration as the measurement apparatus 10 shown in FIG. 1, and therefore components having substantially the same function and configuration are given the same reference numerals and the following description includes only differing points.

In the first modification, the control section 12 outputs from the waveform generating apparatus 200 a sine wave signal on which the trigger signal is superimposed. In other words, the control section 12 outputs the trigger signal and the sine wave signal through the same transmission line. As shown in FIG. 7, the control section 12 outputs from the waveform generating apparatus 200 a signal obtained by adding to the sine wave signal the trigger signal having a pulse waveform with an amplitude greater than the amplitude of the sine wave signal.

The measurement apparatus 10 according to the present modification further includes a trigger extracting section 22. The trigger extracting section 22 extracts only the trigger signal from the sine wave signal on which the trigger signal is superimposed.

For example, when the trigger signal has a pulse waveform with an amplitude greater than the amplitude of the sine wave signal, the trigger extracting section 22 detects, as the trigger signal, the waveform portion that is greater than or equal to a threshold value that is greater than the amplitude of the sine wave signal, from the sine wave signal on which the trigger signal is superimposed. More specifically, the trigger extracting section 22 compares a threshold value that is less than the amplitude of the trigger signal and greater than the amplitude of the sine wave signal to the level of the sine wave signal on which the trigger signal is superimposed, and outputs as the trigger signal a signal that indicates a timing and has a level greater than the threshold value. In this way, the trigger extracting section 22 can extract the trigger signal from the sine wave signal on which the trigger signal is superimposed. The trigger extracting section 22 supplies the extracted trigger signal to the measuring section 14.

The measuring section 14 receives the trigger signal supplied from the trigger extracting section 22 and measures the amplitude and phase of the sine wave signal output from the waveform generating apparatus 200, using the received trigger signal as a reference. When measuring the amplitude and phase using the quadrature sampling technique, the measuring section 14 measures the amplitude and phase based on the sample values at times that avoid the trigger signal.

With the measurement apparatus 10 according to the present modification, the trigger signal and the sine wave signals are transmitted on the same transmission path, and therefore the frequency of the waveform generating apparatus 200 can be measured without including errors caused by transmission line delay difference.

Figure 8:
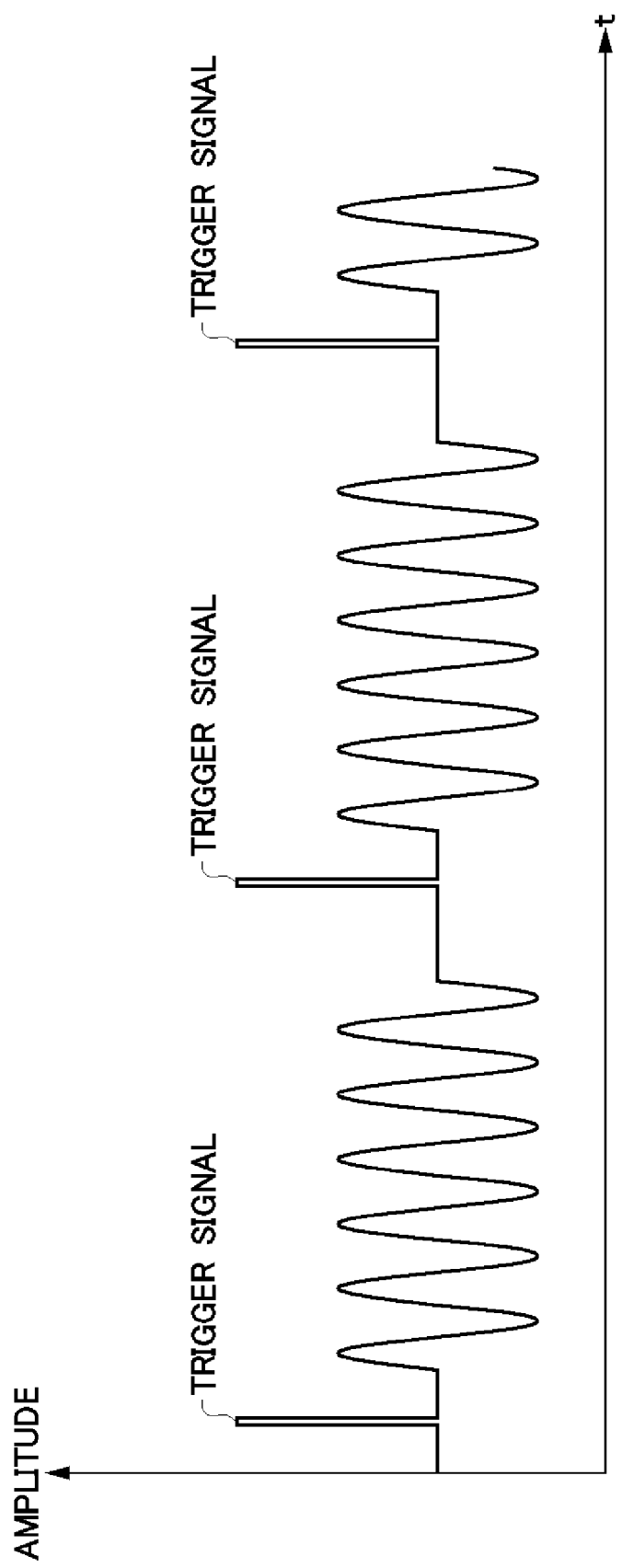
FIG. 8 shows another exemplary sine wave signal on which the trigger signal is superimposed.

FIG. 8 shows another exemplary sine wave signal on which the trigger signal is superimposed. In the first modification, as shown in FIG. 8, the control section 12 may superimpose the trigger signal while temporally changing the generation timing of the trigger signal and the generation timing of the sine wave signal. For example, the control section 12 may output the sine wave signal during a period between trigger signals.

In this way, the measurement apparatus 10 of the present modification can more easily output the sine wave signal and the trigger signal. Furthermore, the waveform of the sine wave signal under measurement is not distorted by the trigger signal, and therefore the measurement apparatus 10 can more accurately measure the amplitude and phase of the sine wave signal.

Figure 9:
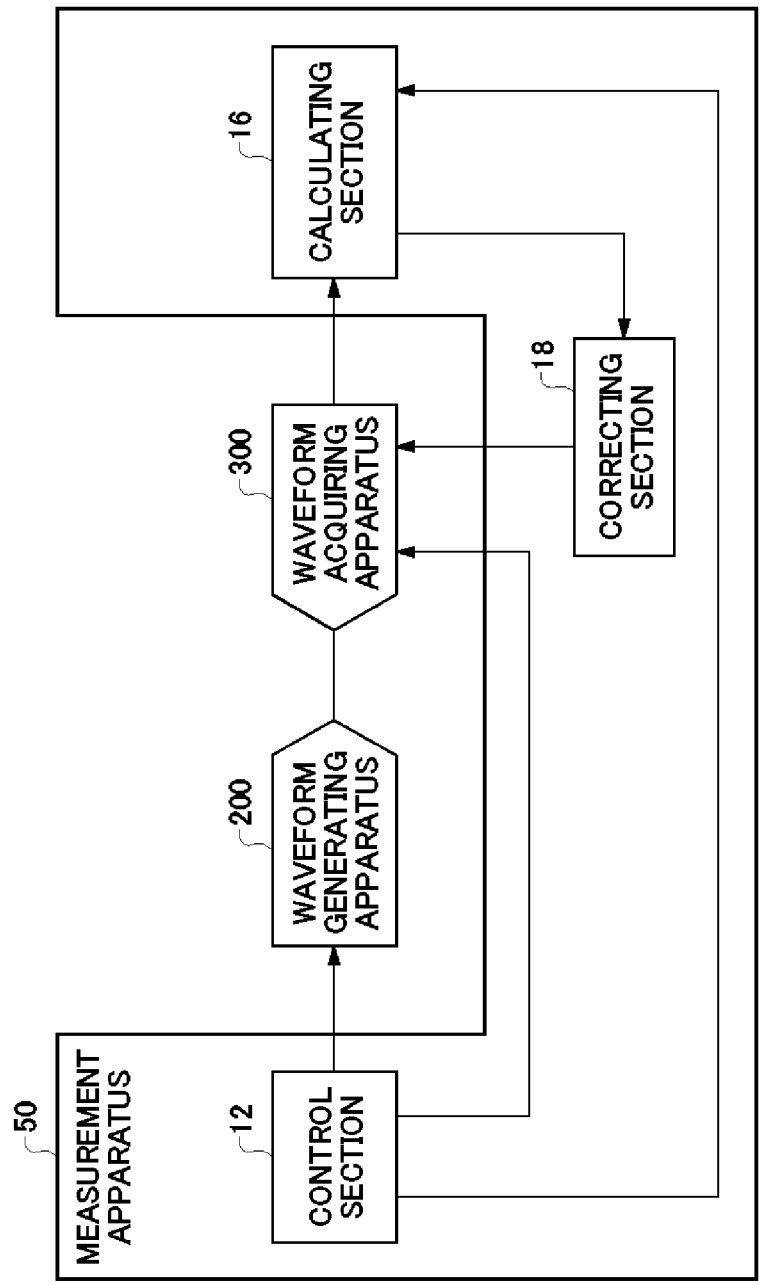
FIG. 9 shows a configuration of a measurement apparatus 50 according to a second modification of the present embodiment, along with a waveform acquiring apparatus 300 and the waveform generating apparatus 200 serving as a reference.

FIG. 9 shows a configuration of a measurement apparatus 50 according to a second modification of the present embodiment, along with a waveform acquiring apparatus 300 and the waveform generating apparatus 200 serving as a reference. The measurement apparatus 50 of the present modification adopts substantially the same function and configuration as the measurement apparatus 10 shown in FIG. 1 or FIG. 6, and therefore components having substantially the same function and configuration are given the same reference numerals and the following description includes only differing points.

The measurement apparatus 50 of the second modification corrects the frequency characteristic of the waveform acquiring apparatus 300 by using the waveform generating apparatus 200 that has already had its frequency characteristic corrected as a reference. The waveform generating apparatus 200 serving as a reference is corrected in advance by the measurement apparatus 10 shown in FIG. 1 or 6.

The measurement apparatus 50 of the second modification includes a control section 12, a calculating section 16, and a correcting section 18. The control section 12 outputs a measurement signal from the waveform generating apparatus 200 serving as a reference. The control section 12 outputs a square wave signal, for example, as the measurement signal.

The control section 12 may sequentially output from the waveform generating apparatus 200, as the measurement signal, a plurality of sine wave signals having different frequencies. In this case, the control section 12 outputs each of the sine wave signals with the trigger signal imposed thereon, as shown in FIG. 7 or 8.

The control section 12 causes the waveform acquiring apparatus 300 to acquire the waveform of the signal output from the waveform generating apparatus 200 serving as a reference. The waveform acquiring apparatus 300 performs an analog/digital conversion on the signal output from the waveform generating apparatus 200, and stores in an internal memory waveform data indicating the waveform of the signal output from the waveform generating apparatus 200.

The calculating section 16 calculates the frequency characteristic of the waveform acquiring apparatus 300 based on the waveform data indicating the waveform of the signal output from the waveform generating apparatus 200 serving as a reference and on the waveform data indicating the waveform of the signal acquired by the waveform acquiring apparatus 300.

For example, the calculating section 16 calculates, as the amplitude characteristic, a ratio of the amplitude of the signal acquired by the waveform acquiring apparatus 300 to the amplitude of the signal output from the waveform generating apparatus 200 serving as a reference, for each frequency component. As another example, the calculating section 16 calculates, as the phase characteristic, a value obtained by subtracting the phase of the signal output from the waveform generating apparatus 200 serving as a reference from the phase of the signal acquired by the waveform acquiring apparatus 300, for each frequency component.

The correcting section 18 corrects the frequency characteristic of the waveform acquiring apparatus 300 based on the frequency characteristic calculated by the calculating section 16. For example, the correcting section 18 may correct the waveform acquiring apparatus 300 such that the inverse characteristic of the calculated frequency characteristic is added to the original frequency characteristic of the waveform acquiring apparatus 300. With this configuration, the measurement apparatus 50 of the present modification can correct the waveform acquiring apparatus 300 such that the frequency characteristic becomes flat.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures a frequency characteristic of a waveform generating apparatus generating a signal having a waveform corresponding to waveform data, comprising:
    a control section that
        causes trigger signals to be output from the waveform generating apparatus, and
        causes a plurality of sine wave signals having different frequencies to be sequentially output from the waveform generating apparatus in synchronization with the trigger signals and with the trigger signals superimposed thereon;
    a measuring section that measures a phase of each of the sine wave signals output from the waveform generating apparatus using a corresponding trigger signal as a reference; and
    a calculating section that calculates a frequency characteristic of the waveform generating apparatus based on the measurement results of the measuring section;
    wherein the control section superimposes the trigger signals having amplitudes greater than the amplitudes of the sine wave signals on the sine wave signals, and the measuring section detects, as a trigger signal, a waveform with an amplitude that is greater than or equal to a threshold value that is larger than the amplitude of the corresponding sine wave signal, from the sine wave signal on which the trigger signal is superimposed.

2. The measurement apparatus according to claim 1, wherein the measuring section is an oscilloscope that receives the trigger signals and the sine wave signals and acquires each of the sine wave signals using the trigger signals as a reference.

3. The measurement apparatus according to claim 1, wherein the control section causes the trigger signals to be output from the waveform generating apparatus with a prescribed period and causes the sine wave signals having frequencies that are integer multiples of a frequency of the trigger signals to be output from the waveform generating apparatus.

4. The measurement apparatus according to claim 1, wherein the control section causes the trigger signals and the sine wave signals to be output from the waveform generating apparatus in parallel.

5. The measurement apparatus according to claim 1, wherein the control section causes the sine wave signals to be output during intervals differing from the generation timing of the trigger signals.

6. The measurement apparatus according to claim 1, wherein the measuring section calculates an amplitude and phase of each sine wave signal based on levels of sample points acquired while shifting the phase by ¼ of the period at a time.

7. The measurement apparatus according to claim 1, further comprising a correcting section that corrects the waveform generating apparatus such that an inverse characteristic of the calculated frequency characteristic is added thereto.

8. A measurement apparatus that measures a frequency characteristic of a waveform generating apparatus generating a signal having a waveform corresponding to waveform data, comprising:
    a control section that
        causes a trigger signal to be output from the waveform generating apparatus and
        causes a signal under measurement to be output from the waveform generating apparatus in synchronization with the trigger signal and with the trigger signal superimposed thereon;
    a measuring section that measures the phase of the signal under measurement output from the waveform generating apparatus using the trigger signal as a reference; and
    a calculating section that calculates a frequency characteristic of the waveform generating apparatus based on the measurement results of the measuring section;
    wherein the control section superimposes the trigger signal having an amplitude greater than the amplitude of the signal under measurement on the signal under measurement, and the measuring section detects, as a trigger signal, a waveform with an amplitude that is greater than or equal to a threshold value that is larger than the amplitude of the signal under measurement, from the signal under measurement on which the trigger signal is superimposed.

9. A measurement apparatus that measures a frequency characteristic of a waveform acquiring apparatus generating waveform data by sampling a signal, comprising:
a control section that
causes trigger signals to be output from a waveform generating apparatus,
causes a plurality of sine wave signals having different frequencies to be output sequentially from the waveform generating apparatus in synchronization with the trigger signals and with the trigger signals superimposed thereon, and
causes the waveform acquiring apparatus to acquire waveform data of the sine wave signals;
a measuring section that measures a phase of each of the sine wave signals output from the waveform generating apparatus using a corresponding trigger signal as a reference; and
a calculating section that calculates a frequency characteristic of the waveform acquiring apparatus based on the waveform data of each sine wave signal acquired by the waveform acquiring apparatus;
wherein the control section superimposes the trigger signals having amplitudes greater than the amplitudes of the sine wave signals on the sine wave signals, and the measuring section detects, as a trigger signal, a waveform with an amplitude that is greater than or equal to a threshold value that is larger than the amplitude of the corresponding sine wave signal, from the sine wave signal on which the trigger signal is superimposed.

10. A measurement method for measuring a frequency characteristic of a waveform generating apparatus generating a signal having a waveform corresponding to waveform data, comprising:
causing trigger signals to be output from the waveform generating apparatus,
causing a plurality of sine wave signals having different frequencies to be sequentially output from the waveform generating apparatus in synchronization with the trigger signals and with the trigger signals superimposed thereon;
measuring a phase of each of the sine wave signals output from the waveform generating apparatus using a corresponding trigger signal as a reference; and
calculating a frequency characteristic of the waveform generating apparatus based on the results of the measuring;
wherein the trigger signals having amplitudes greater than the amplitudes of the sine wave signals are superimposed on the sine wave signals, and a waveform with an amplitude that is greater than or equal to a threshold value that is larger than the amplitude of the corresponding sine wave signal, from the sine wave signal on which the trigger signal is superimposed, is detected as a trigger signal.

11. A measurement method for measuring a frequency characteristic of a waveform generating apparatus generating a signal having a waveform corresponding to waveform data, comprising:
causing a trigger signal to be output from the waveform generating apparatus;
causing a signal under measurement to be output from the waveform generating apparatus in synchronization with the trigger signal and with the trigger signal superimposed thereon;
measuring a phase of the signal under measurement output from the waveform generating apparatus using the trigger signal as a reference; and
calculating a frequency characteristic of the waveform generating apparatus based on the result of the measuring;
wherein the trigger signal having an amplitude greater than the amplitude of the signal under measurement is superimposed on the signal under measurement, and a waveform with an amplitude that is greater than or equal to a threshold value that is larger than the amplitude of the signal under measurement, from the signal under measurement on which the trigger signal is superimposed, is detected as a trigger signal.

12. A measurement method for measuring a frequency characteristic of a waveform acquiring apparatus generating waveform data by sampling a signal, comprising:
causing trigger signals to be output from a waveform generating apparatus;
causing a plurality of sine wave signals having different frequencies to be output sequentially from the waveform generating apparatus in synchronization with the trigger signals and with the trigger signals superimposed thereon;
causing the waveform acquiring apparatus to acquire waveform data of the sine wave signals;
measuring a phase of each of the sine wave signals output from the waveform generating apparatus using a corresponding trigger signal as a reference; and
calculating a frequency characteristic of the waveform acquiring apparatus based on the waveform data of each sine wave signal acquired by the waveform acquiring apparatus;
wherein the trigger signals having amplitudes greater than the amplitudes of the sine wave signals are superimposed on the sine wave signals, and a waveform with an amplitude that is greater than or equal to a threshold value that is larger than the amplitude of the corresponding sine wave signal, from the sine wave signal on which the trigger signal is superimposed, is detected as a trigger signal.

* * * * *